United States Patent
Bentley et al.

(10) Patent No.: US 10,186,577 B2
(45) Date of Patent: Jan. 22, 2019

(54) MULTIPLE DIRECTED SELF-ASSEMBLY MATERIAL MASK PATTERNING FOR FORMING VERTICAL NANOWIRES

(71) Applicant: GLOBALFOUNDRIES Inc., Grand Cayman (KY)

(72) Inventors: Steven Bentley, Watervliet, NY (US); Richard A. Farrell, Albany, NY (US); Gerard Schmid, Rensselaer, NY (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/477,096

(22) Filed: Sep. 4, 2014

(65) Prior Publication Data

US 2016/0071930 A1    Mar. 10, 2016

(51) Int. Cl.
*H01L 29/06* (2006.01)
*H01L 29/78* (2006.01)
(Continued)

(52) U.S. Cl.
CPC .......... *H01L 29/0676* (2013.01); *B82Y 10/00* (2013.01); *B82Y 40/00* (2013.01); *H01L 21/3086* (2013.01); *H01L 21/31144* (2013.01); *H01L 29/068* (2013.01); *H01L 29/0649* (2013.01); *H01L 29/66439* (2013.01); *H01L 29/66469* (2013.01); *H01L 29/775* (2013.01); *H01L 29/7851* (2013.01); *H01L 29/7854* (2013.01)

(58) Field of Classification Search
CPC .......... H01L 29/0676; H01L 21/30604; H01L 21/3086; H01L 21/3105; H01L 29/7851; H01L 29/7854
See application file for complete search history.

(56) References Cited

U.S. PATENT DOCUMENTS 8,541,274 B1 *  9/2013  Xie ................ H01L 21/845
                                              257/E21.635
8,835,255 B2    9/2014  Baldauf et al.
(Continued)

OTHER PUBLICATIONS

Tomioka et al., "Vertical In0.7Ga0.3As Nanowire Surrounding-Gate Transistors with High-k Gate Dielectric on Si Substrate," IEDM11-773-776, 2011 IEEE.
(Continued)

*Primary Examiner* — Fernando L Toledo
*Assistant Examiner* — Lawrence-Lin T Nguyen
(74) *Attorney, Agent, or Firm* — Amerson Law Firm, PLLC

(57) ABSTRACT

A method includes forming a first directed self-assembly material above a substrate. The substrate is patterned using the first directed self-assembly material to define at least one fin in the semiconductor substrate. A second directed self-assembly material is formed above the at least one fin to expose a top surface of the at least one fin. A substantially vertical nanowire is formed on the top surface of the at least one fin. At least a first dimension of the vertical nanowire is defined by an intrinsic pitch of the first directed self-assembly material and a second dimension of the vertical nanowire is defined by an intrinsic pitch of the second directed self-assembly material.

20 Claims, 17 Drawing Sheets

(51) Int. Cl.
*H01L 21/3105* (2006.01)
*H01L 21/308* (2006.01)
*B82Y 10/00* (2011.01)
*B82Y 40/00* (2011.01)
*H01L 29/66* (2006.01)
*H01L 29/775* (2006.01)
*H01L 21/311* (2006.01)

(56) References Cited

U.S. PATENT DOCUMENTS

| | | |
|---|---|---|
| 2005/0236357 A1 | 10/2005 | Bakkers et al. |
| 2011/0021027 A1 | 1/2011 | Johnson |
| 2012/0049252 A1 | 3/2012 | Masuoka et al. |
| 2013/0065371 A1 | 3/2013 | Wei et al. |
| 2013/0092902 A1 | 4/2013 | Bao et al. |
| 2013/0161756 A1* | 6/2013 | Glass ................ H01L 29/66545 257/369 |
| 2013/0224945 A1* | 8/2013 | Liu ................... H01L 29/66545 438/595 |
| 2013/0341704 A1* | 12/2013 | Rachmady ........ H01L 29/66545 257/327 |
| 2014/0170821 A1 | 6/2014 | Nyhus et al. |
| 2014/0285980 A1 | 9/2014 | Cappellani et al. |

OTHER PUBLICATIONS

Office Action from related U.S. Appl. No. 14/476,879 dated Oct. 23, 2015.
Office Action from related U.S. Appl. No. 14/476,918 dated Nov. 12, 2015.
Final Office Action from related U.S. Appl. No. 14/476,918 dated Jul. 6, 2016.
Office Action from related U.S. Appl. No. 14/476,918 dated Jun. 2, 2017.
Final Office Action from related U.S. Appl. No. 14/476,879 dated Nov. 3, 2016.
Notice of Allowance from related U.S. Appl. No. 14/476,918 dated Oct. 4, 2017.

* cited by examiner

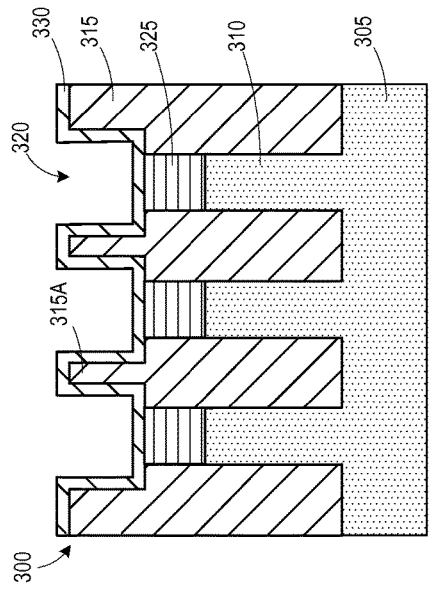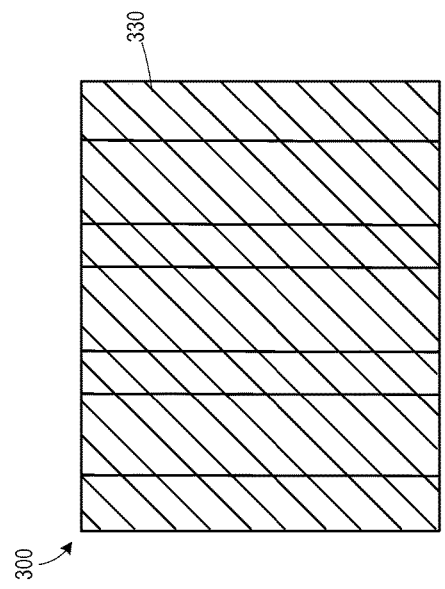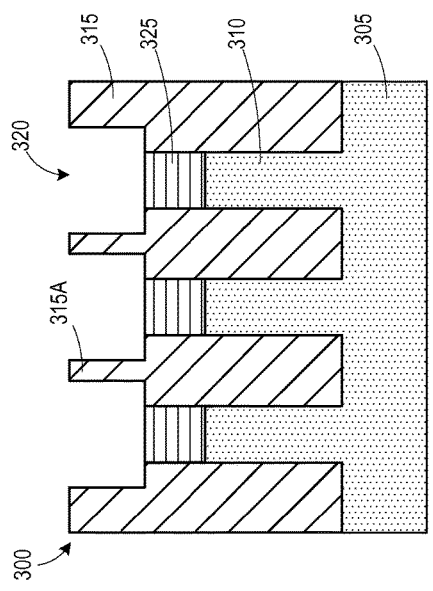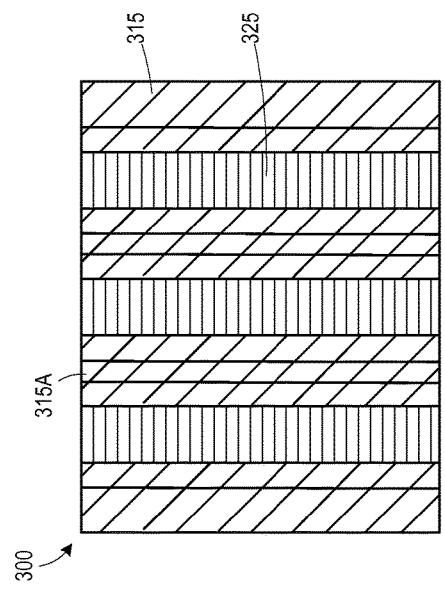

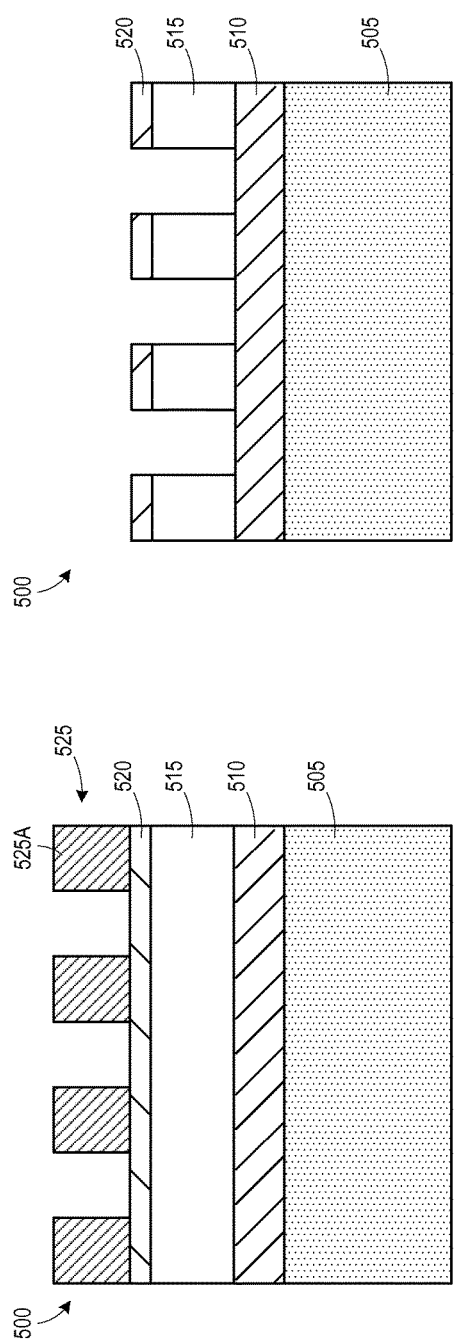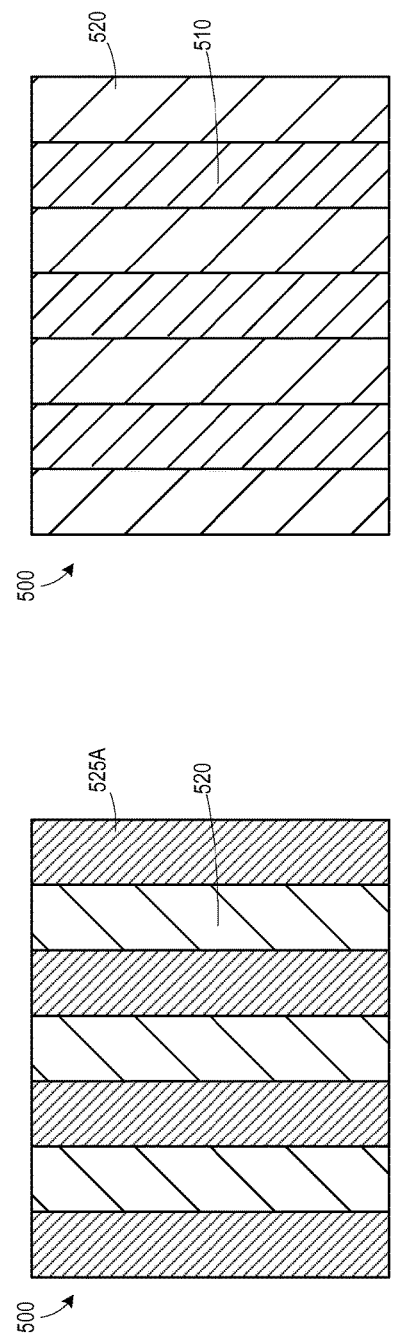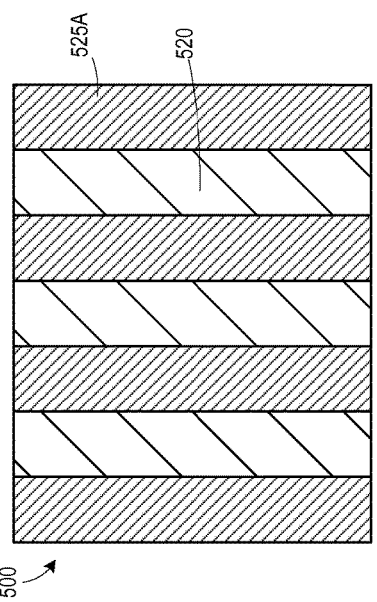

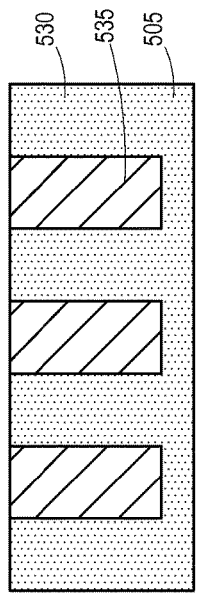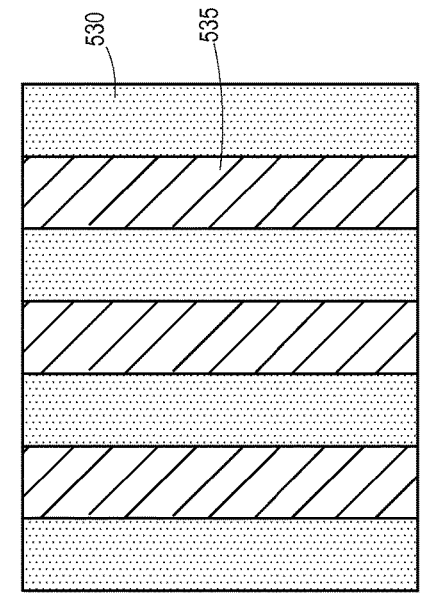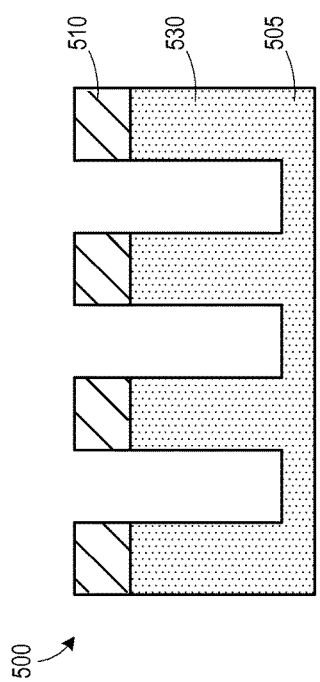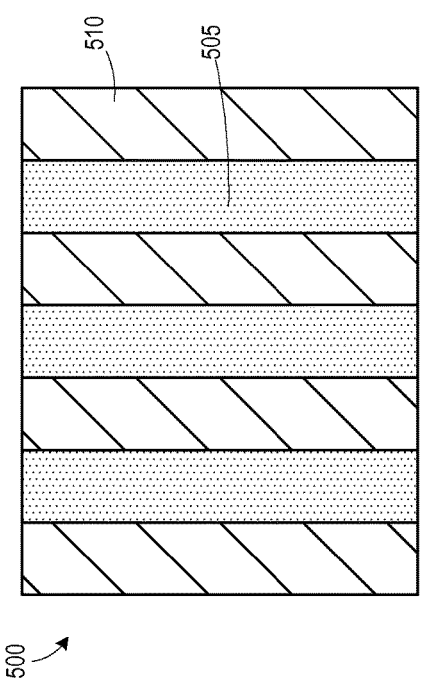

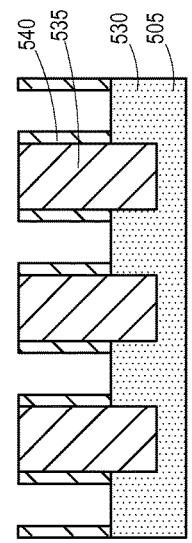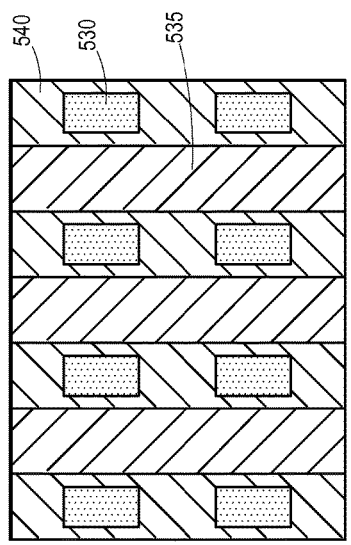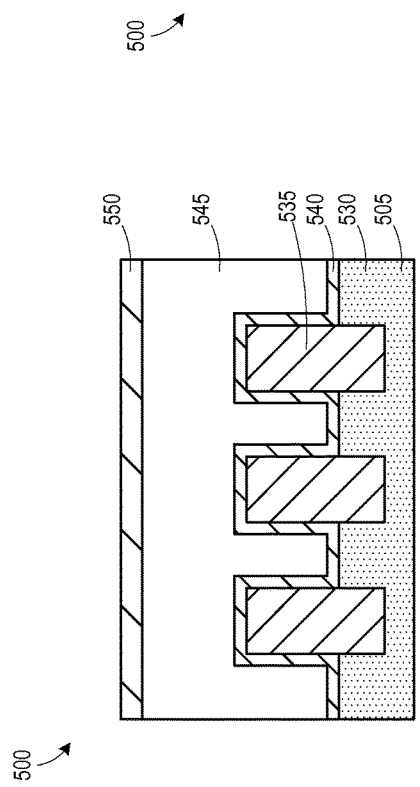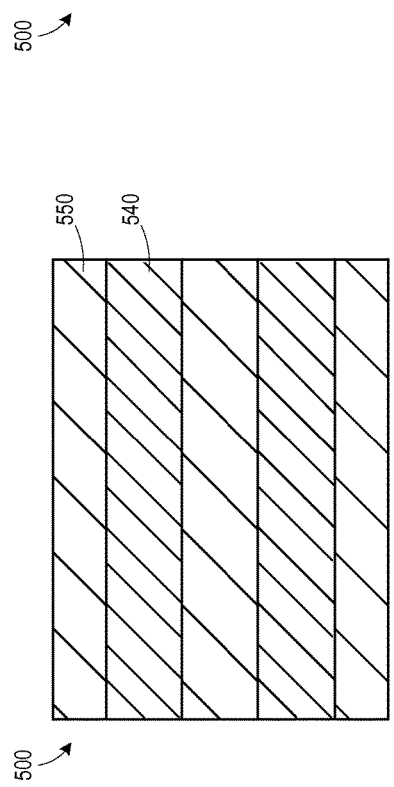
Figure 5K
Figure 6K
Figure 5J
Figure 6J

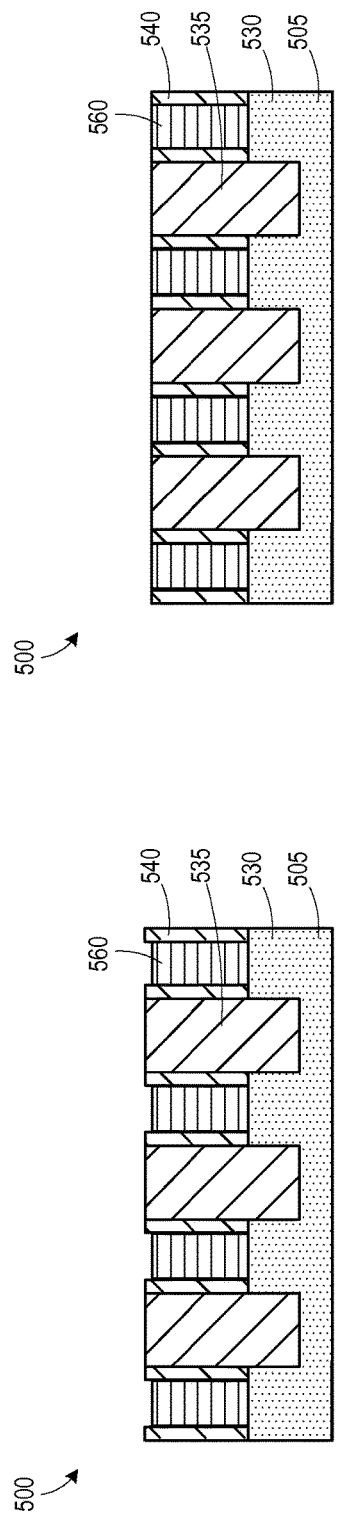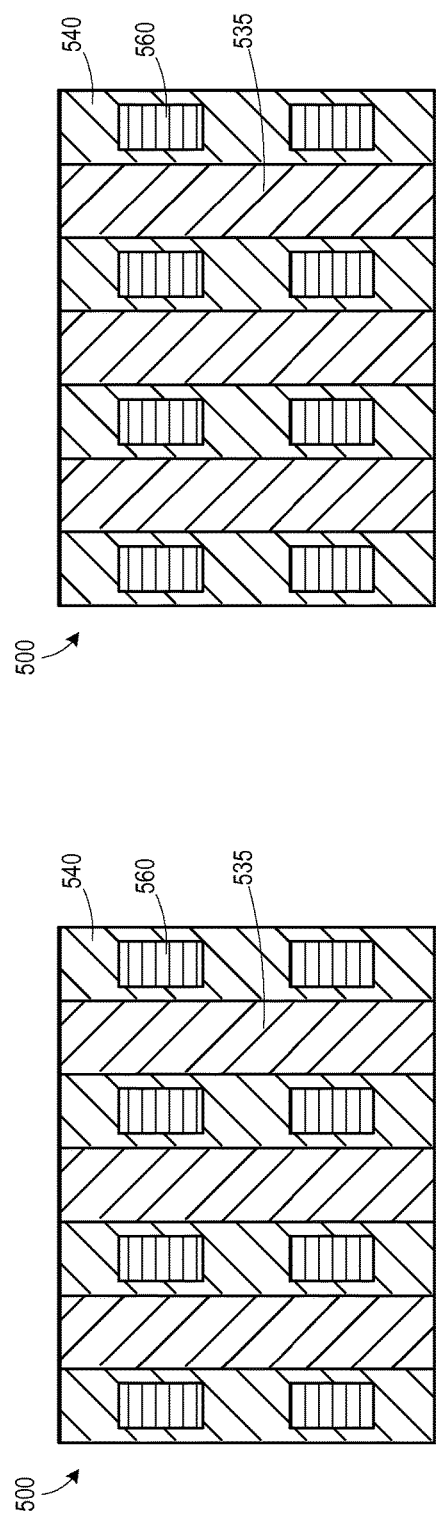

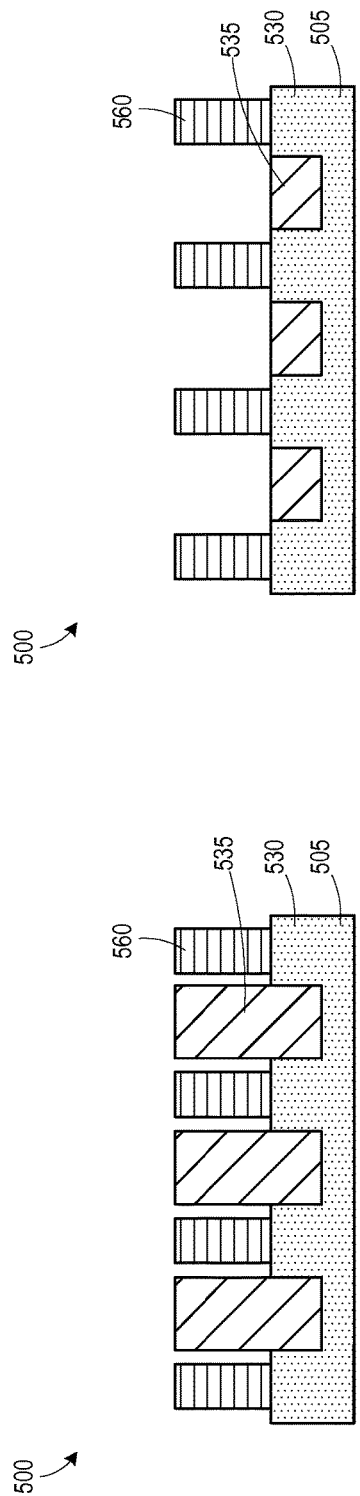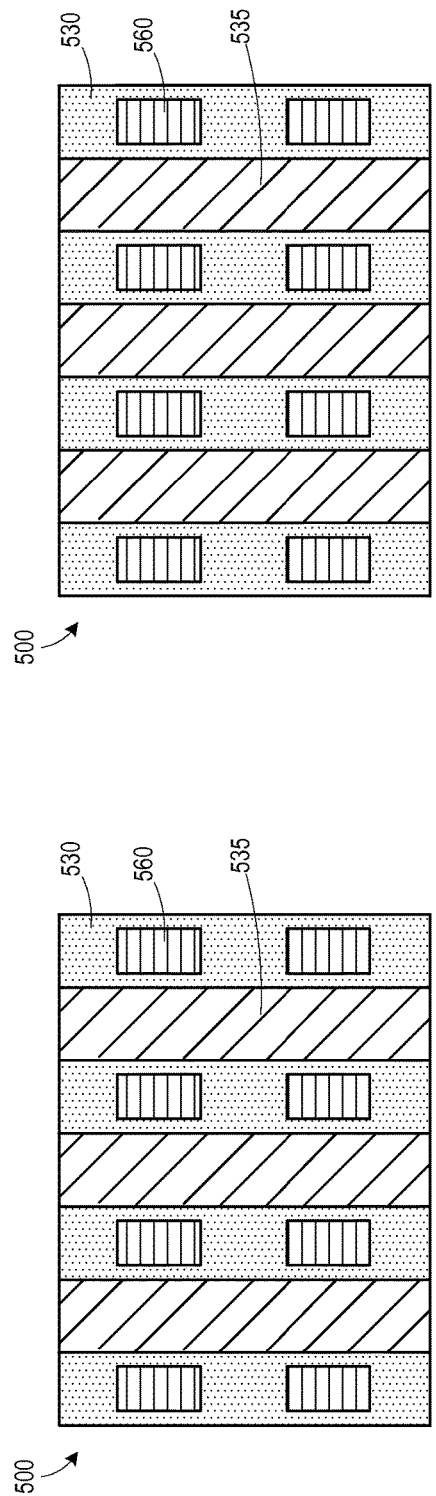

MULTIPLE DIRECTED SELF-ASSEMBLY MATERIAL MASK PATTERNING FOR FORMING VERTICAL NANOWIRES

BACKGROUND OF THE INVENTION

1. Field of the Invention

The present disclosure generally relates to the fabrication of semiconductor devices, and, more particularly, to a multiple directed self-assembly material mask patterning process for forming vertical nanowires.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped semiconductor source/drain regions that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

The performance and scalability of semiconductor devices, such as FETs, is thus limited by the dimensions achievable by the photolithography and patterning processes and the material of the channels. Future technology nodes may require regions of the wafer to be replaced with higher mobility channel materials and to employ vertical device topology to decouple the channel length and contact lengths from the lateral device pitch. While such vertical topologies offer scaling and cost reduction benefits, the formation of high aspect ratio vertical devices is difficult and is still limited by lithographic constraints.

The present disclosure is directed to various methods for forming vertical nanowires and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming vertical nanowires. A method includes forming a first directed self-assembly material above a substrate. The substrate is patterned using the first directed self-assembly material to define at least one fin in the semiconductor substrate. A second directed self-assembly material is formed above the at least one fin to expose a top surface of the at least one fin. A substantially vertical nanowire is formed on the top surface of the at least one fin. At least a first dimension of the vertical nanowire is defined by an intrinsic pitch of the first directed self-assembly material and a second dimension of the vertical nanowire is defined by an intrinsic pitch of the second directed self-assembly material.

Another illustrative method includes forming a first hard mask layer above a semiconductor substrate. A first directed self-assembly material is formed above the first hard mask layer. The hard mask layer is patterned using a portion of the first directed self-assembly material as an etch mask to expose a portion of the semiconductor substrate. The semiconductor substrate is etched using the patterned hard mask layer as an etch mask to define at least one fin in the semiconductor substrate. A second hard mask layer is formed above the at least one fin. A second directed self-assembly material is formed above the second hard mask layer. The second hard mask layer is patterned using a portion of the second directed self-assembly layer as an etch mask to expose a top surface of the at least one fin. A substantially vertical nanowire is formed on the top surface of the at least one fin. At least a first dimension of the vertical nanowire is defined by an intrinsic pitch of the first directed self-assembly material and a second dimension of the vertical nanowire is defined by an intrinsic pitch of the second directed self-assembly material.

One illustrative device includes, among other things, at least one fin defined in a semiconductor substrate and a substantially vertical nanowire having a rectangular cross-section disposed on a top surface of the fin and having a width less than a width of the at least one fin.

BRIEF DESCRIPTION OF THE DRAWINGS

The disclosure may be understood by reference to the following description taken in conjunction with the accompanying drawings, in which like reference numerals identify like elements, and in which:

FIGS. 3A-3J are cross-sectional views of a device depicting methods disclosed herein for forming vertical nanowires using a subtractive process flow;

FIGS. 4A-4J are top views of the device corresponding to FIGS. 3A-3J;

Figure 1A:
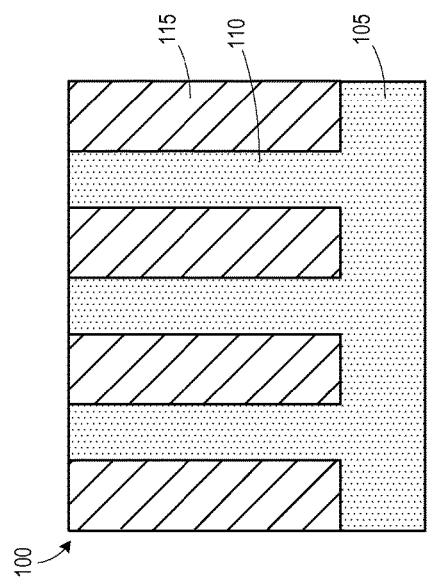
FIGS. 1A-1I are cross-sectional views of a device depicting methods disclosed herein for forming vertical nanowires using an additive process flow.
Figure 2A:
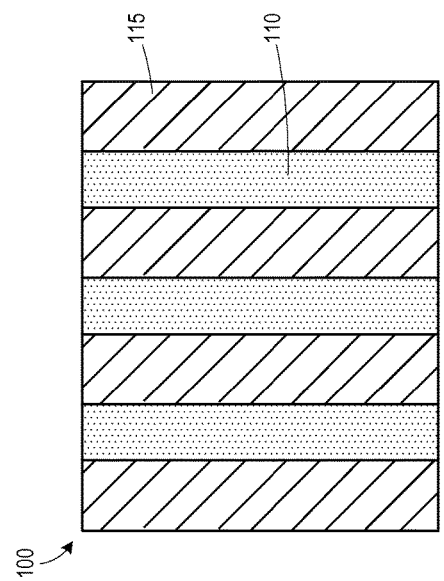
FIGS. 2A-2I are top views of the device corresponding to FIGS. 1A-1I.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming nanowires on semiconductor material fins and the resulting semiconductor devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 1A-1I and 2A-2I illustrate various novel methods disclosed herein for forming vertical nanowires in a device 100 using an additive process flow. FIGS. 1A-1I show cross-sectional views of the device 100 and FIGS. 2A-2I show corresponding top views of the device 100. The device 100 includes a substrate 105 with fins 110 defined therein. An insulating layer 115 (e.g., silicon dioxide, low-k dielectric having a dielectric constant less than about 3.5) is disposed between the fins 110 to define an isolation structure. The substrate 105 may have a variety of configurations, such as the bulk silicon configuration illustrated. Alternatively, the substrate 105 may have a silicon-on-insulator (SOI) configuration that includes a bulk silicon layer, a buried insulation layer and an active layer, wherein semiconductor devices including the fins 110 are formed in and above the active layer. The substrate 105 may be formed of silicon or silicon/germanium or it may be made of materials other than silicon, such as germanium. Thus, the terms "substrate" or "semiconductor substrate" should be understood to cover all semiconducting materials and all forms of such materials. The substrate 105 may have different layers other than those illustrated and may include epitaxially-deposited semiconductor layers. Additionally, the fins 110 may include different semiconductor materials from the substrate 105, or may be the same material.

Figure 1B:
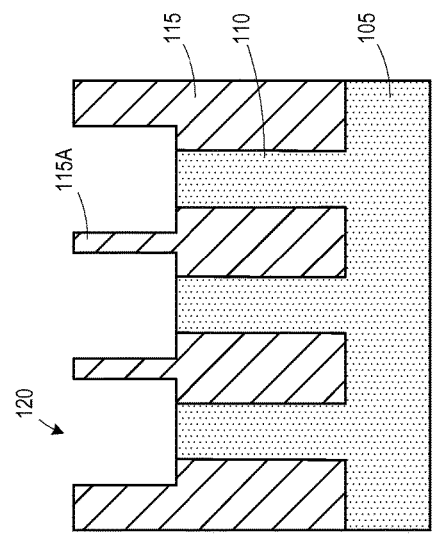
Figure 2B:
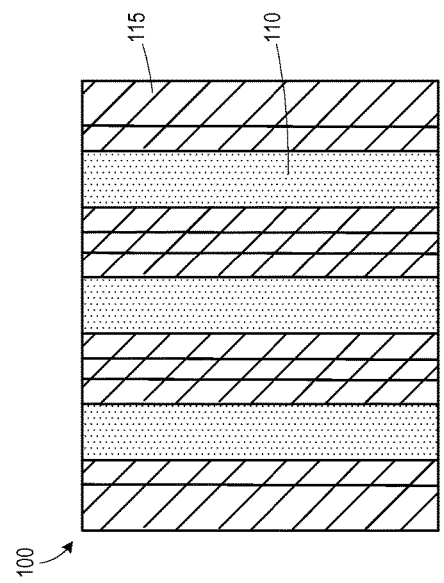
Figure 1C:
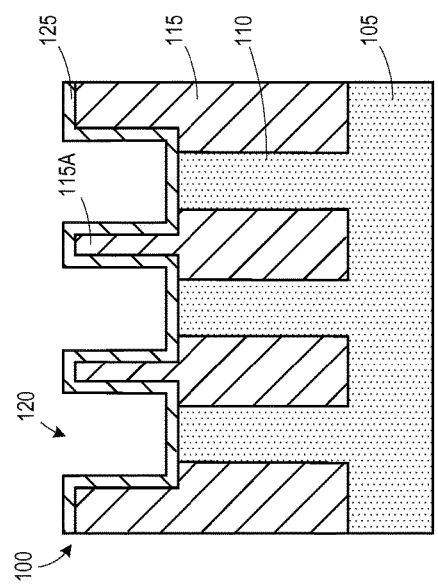
Figure 2C:
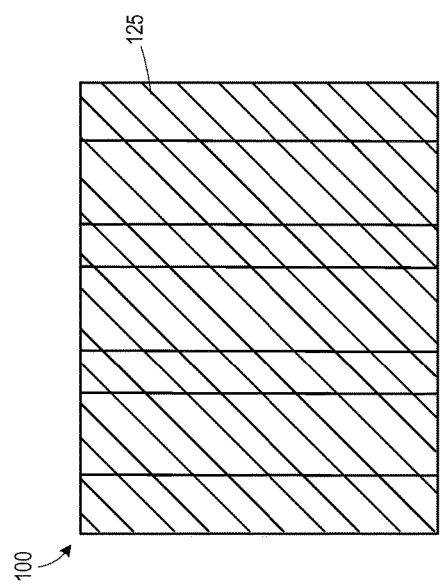

FIGS. 1B and 2B illustrate the device 100 after several etch processes were performed to form recesses 120 in the fins 110 and the surrounding insulating layer 115. It should be understood that this process may be applied selectively to some areas of the wafer, or may comprise multiple processes, either isotropic or anisotropic. These etch processes result in upstanding portions 115A of the insulating material 115 being positioned between the fins 110. FIGS. 1C and 2C illustrate the device 100 after performing a deposition process to form a hard mask layer 125 (e.g., nitride or oxide material that may be etched selectively to the insulating layer 115) in the recesses 120 and around the upstanding portions 115A.

Figure 1D:
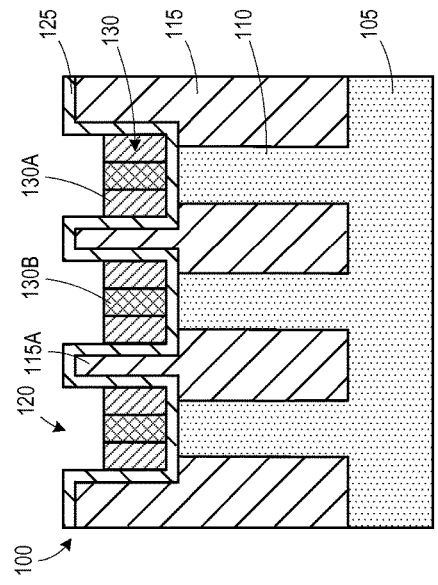
Figure 2D:
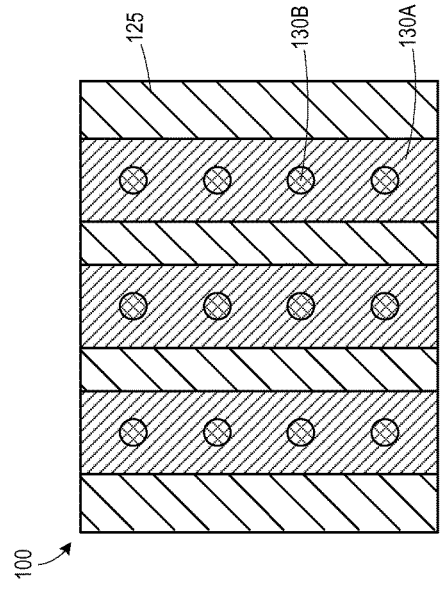

FIGS. 1D and 2D illustrate the device 100 after performing one or more processes to form a directed self-assembly (DSA) material layer 130 in the recesses 120, a process known as grapheoepitaxy. In the illustrative example, the DSA material is a vertical cylinder-forming, organic-organic block copolymer, such as polystyrene-block methyl methacrylate (PS-b-MMA), or an organic-inorganic block copolymer, such as polystyrene-block-polydimenthysiloxane (PS-b-PDMS), however, other DSA materials may be used, such as line-space forming or spherical forming materials. In the context of FIGS. 1D and 2D, the DSA material includes an etch-resistant component 130A and an etchable component 130B that defines a plurality of vertical cylinders. In general, the components 130A, 130B are induced to separate into distinct phases and thereby form features with a characteristic pitch that is defined by the chemical composition. The DSA process is driven by thermodynamic instability. This phase separation can be promoted by any of several annealing processes, such as thermal annealing (baking), solvent annealing, or combinations thereof. The DSA material has intrinsic phase morphology and periodicity/pitch. These properties are determined by the chemical composition of the material and can be fine-tuned by changing the chemical composition. Processes for forming the DSA materials and processing the deposited material to form the ordered pattern are known to those of ordinary skill in the art, so they are not described in greater detail herein. In some embodiments, the DSA material layer 130 may include an underlying brush mat layer or chemically functionalized surface (not shown) to affect the manner in which the components 130A, 130B form. The pitch of the components and the diameter of the cylinder components 130B depends on the DSA materials selected and the relative lengths of the polymer chains.

Figure 1E:
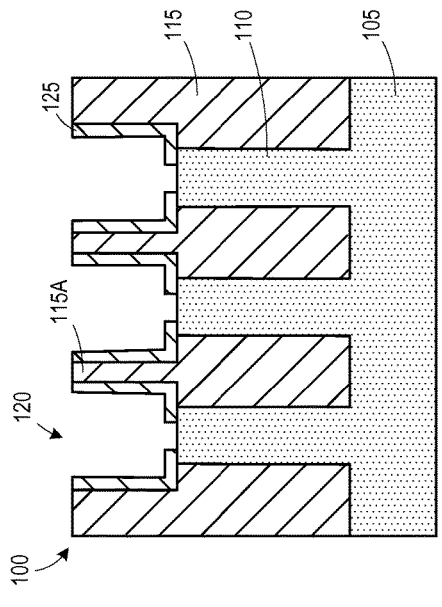
Figure 1F:
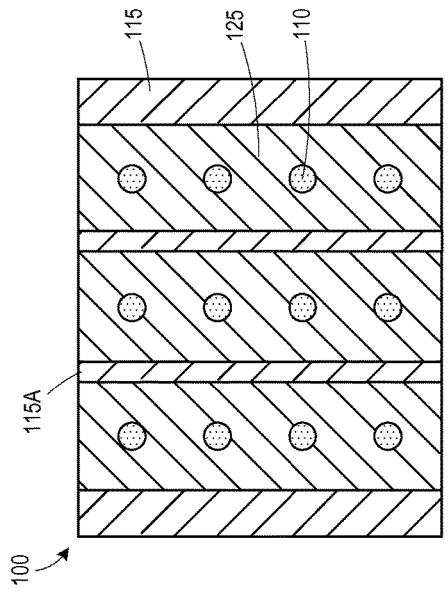
Figure 2E:
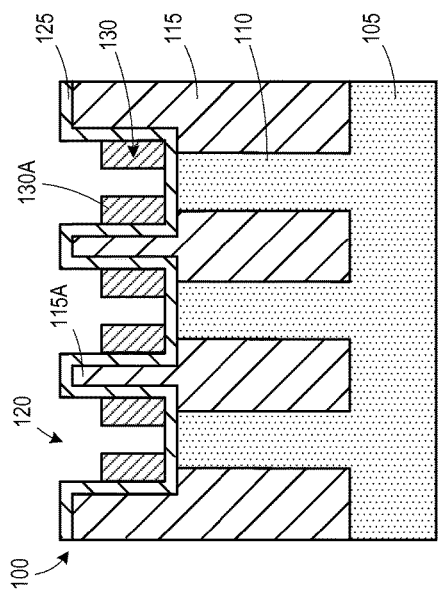
Figure 2F:
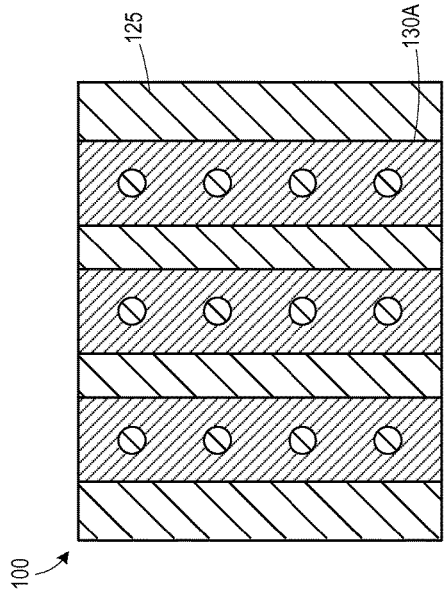

FIGS. 1E and 2E illustrate the device 100 after performing a selective etch process (e.g., wet or dry) to remove the component 130B selective to the component 130A. FIGS. 1F and 2F illustrate the device 100 after performing a first anisotropic breakthrough etch process to remove portions of the hard mask layer 125 not covered by the DSA components 130A to expose the fins 110 and a second etch process to remove the DSA components 130A.

Figure 1G:
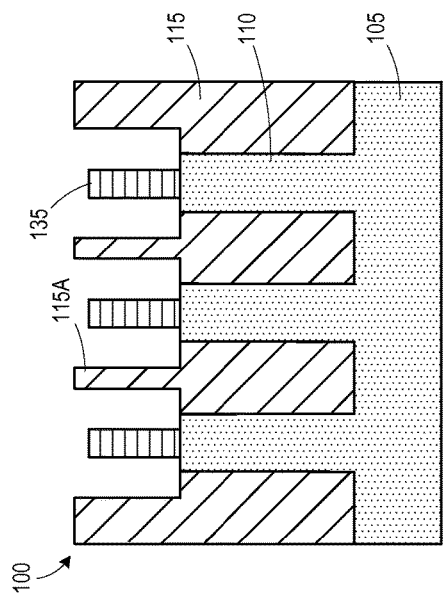
Figure 2G:
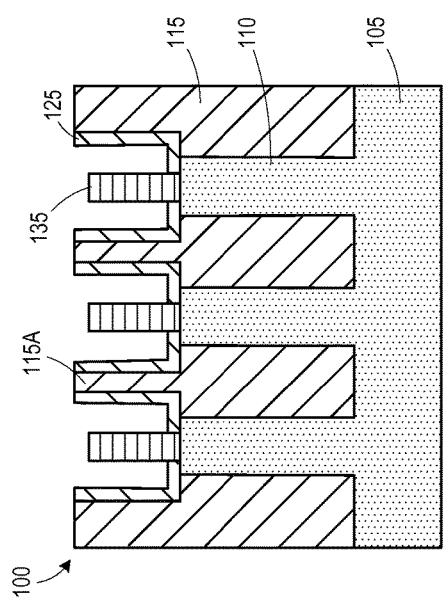

FIGS. 1G and 2G illustrate the device 100 after performing a selective epitaxial growth process to define vertical nanowires 135 (e.g., epi-grown III-V or group IV materials—Si/SiGe/Ge, GaAs/InGaAs/InAs/GaSb/InGaSb, etc.) on the exposed top surfaces of the fins 110. This step may optionally additionally include polishing and/or etch-back processes to achieve the desired structure.

Figure 1H:
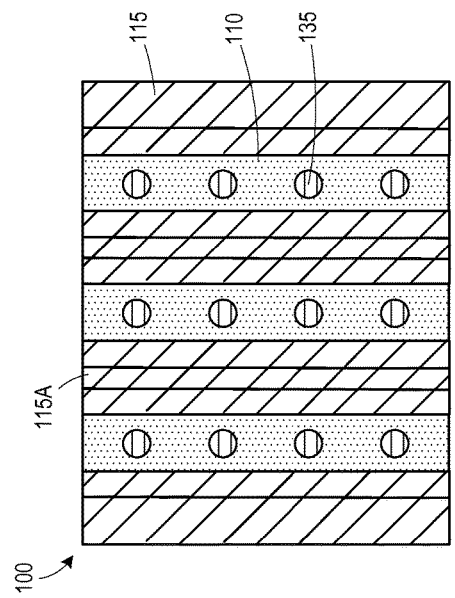
Figure 2H:
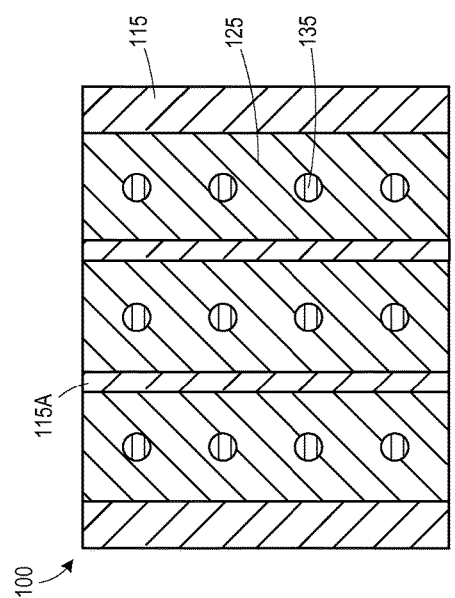
Figure 3A:
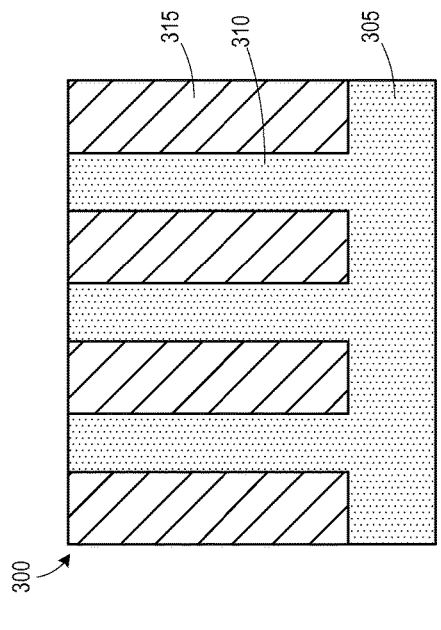
Figure 4A:
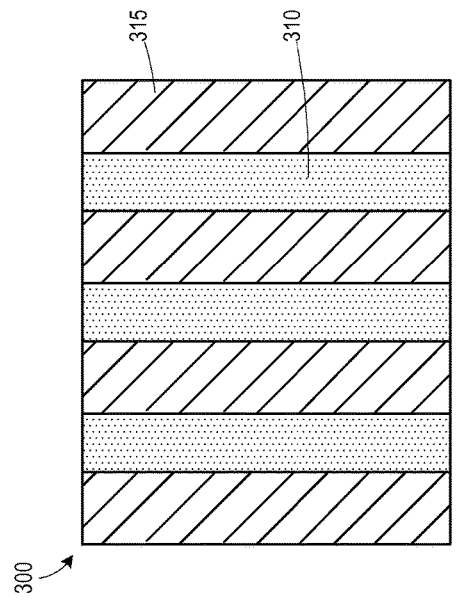

FIGS. 1H and 2H illustrate the device 100 after performing an isotropic etch process to remove the hard mask layer 125. This process re-exposes the upstanding portions 115A of the insulating layer 115 The cross-sectional dimensions of the vertical nanowires 135 are determined by the intrinsic pitch of the DSA component 130B. The vertical nanowires 135 are substantially vertical in that they have roughly the same cross-section along their long axes. Of course, some variation may exist due to non-uniformities in the epitaxial growth process. In general, the long axis of one of the vertical nanowires 135 is oriented substantially normally with respect to a top surface of the fin 110 and the vertical nanowires 135 have an oval shaped cross-section (e.g., circular).

Figure 1I:
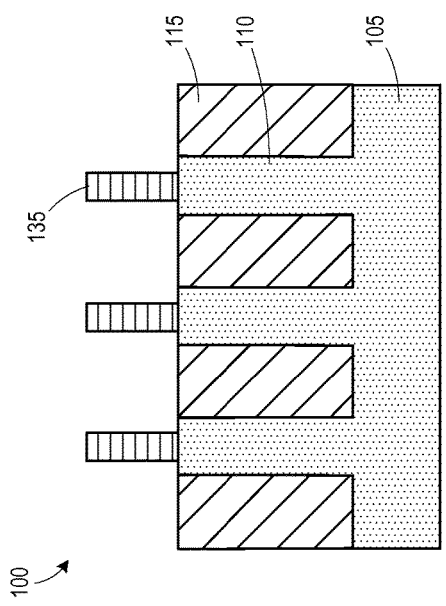
Figure 2I:
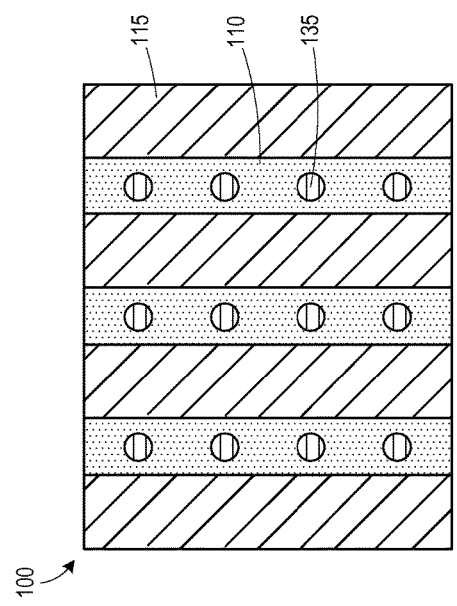

FIGS. 1I and 2I illustrate the device 100 after performing a timed etching process to remove the upstanding portions 115A of the insulating layer 115 selectively to the material of the nanowires 135. An isotropic etch may remove the upstanding portions 115A in the insulating layer material much faster than removing material on the exposed planar surfaces due to the exposure of the upstanding portions 115A to the etch environment on three sides, dependent on the geometry of the upstanding features 115A. Some recessing of the planar surface of the insulating layer 115 may also occur, but for ease of illustration, such recessing is not depicted.

FIGS. 3A-3J and 4A-4J illustrate an alternative method for forming vertical nanowires in a device 300 using a subtractive process flow. FIGS. 3A-3I show cross-sectional views of the device 300 and FIGS. 4A-4I show corresponding top views of the device 300.

Figure 3B:
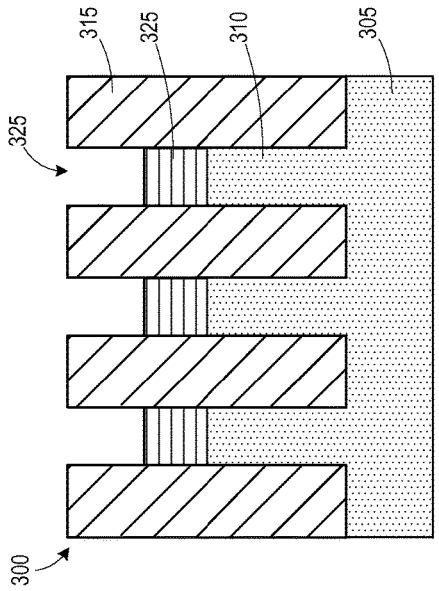
Figure 4B:
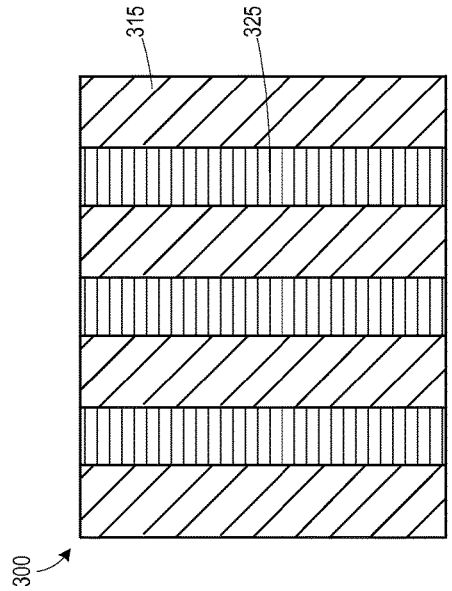
Figure 3C:
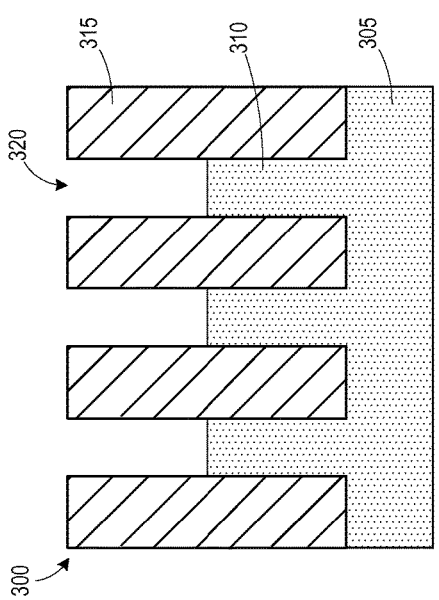
Figure 4C:
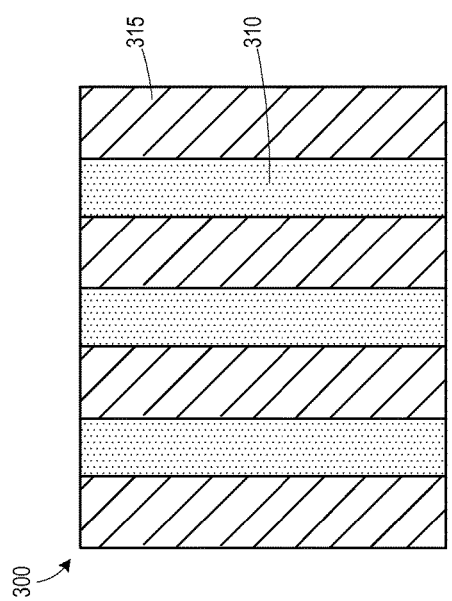

The device 300 includes a substrate 305 with fins 310 defined therein. An insulating layer 315 (e.g., silicon dioxide) is disposed between the fins 310 to define an isolation structure. The substrate 305 may have a variety of configurations, as described above. FIGS. 3B and 4B illustrate the device 300 after an etch process (e.g., anisotropic or isotropic) to form recesses 320 in the fins 310. FIGS. 3C and 4C illustrate the device 300 after an epitaxial growth process to define nanowire material 325 (e.g., epi-grown III-V or group IV materials—Si/SiGe/Ge, GaAs/InGaAs/InAs/GaSb/InGaSb, etc.) on the recessed fins 310 so as to partially fill the recesses 320. This step may optionally involve additional polishing and/or etch-back processes to achieve the desired structure.

FIGS. 3D and 4D illustrate the device 300 after performing an isotropic etch to laterally widen the recesses 320 in the insulating layer 315. Some recessing of the horizontal surfaces of the insulating layer 315 may also occur during the isotropic etch process, but for ease of illustration, this recessing is not depicted. This etch process results in upstanding portions 315A of the insulating material 315 being positioned between the fins 310. FIGS. 3E and 4E illustrate the device 300 after performing a deposition process to form a hard mask layer 330 (e.g., nitride or oxide material that may be etched selectively to the insulating layer 315) in the recesses 320 and around the upstanding portions 315A.

Figure 3F:
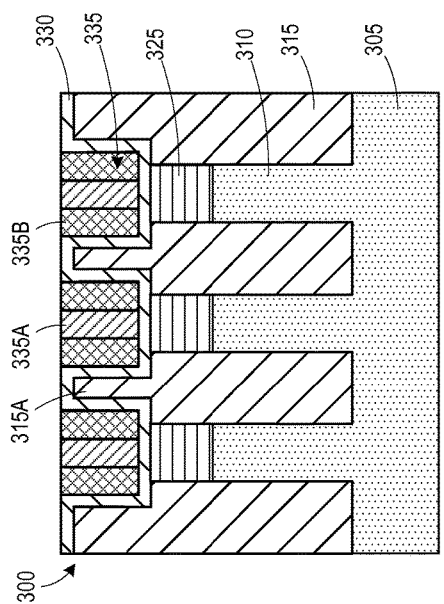
Figure 4F:
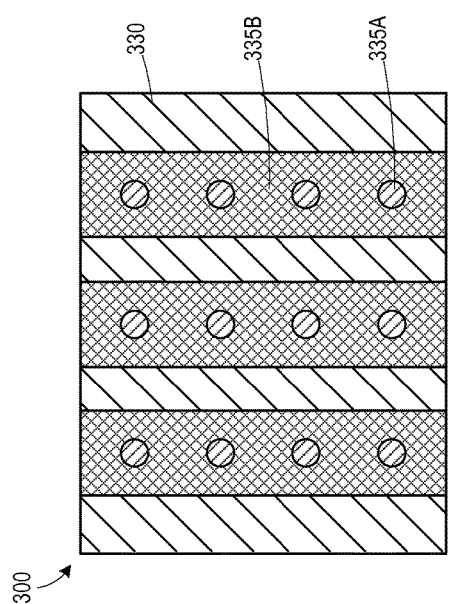

FIGS. 3F and 4F illustrate the device 300 after performing one or more processes to form a directed self-assembly (DSA) material layer 335 in the recesses 320. The DSA material includes an etch-resistant component 335A and an etchable component 335B that defines a plurality of vertical cylinders. As described above, the DSA material layer 335 may include a brush mat layer or a chemically-functionalized surface to control the orientation of the components 335A, 335B.

Figure 3G:
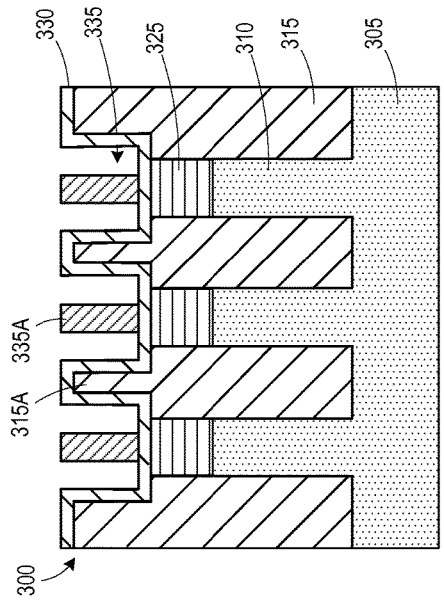
Figure 4G:
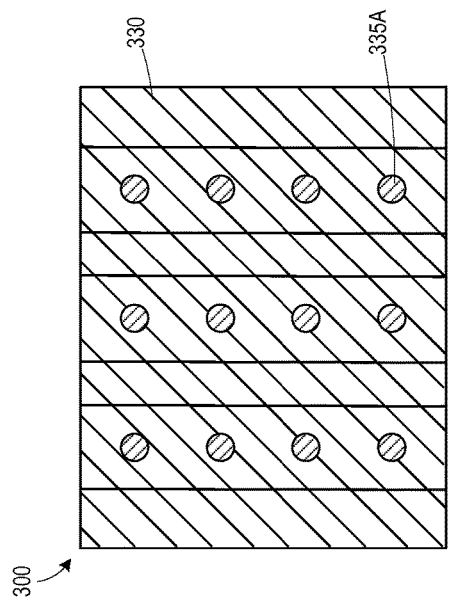

FIGS. 3G and 4G illustrate the device 300 after performing a selective etch process (e.g., wet or dry) to remove the component 335B selective to the component 335A. FIGS. 3H and 4H illustrate the device 300 after performing an anisotropic etch to remove the hard mask layer 330 and re-expose the upstanding portions 315A.

Figure 3I:
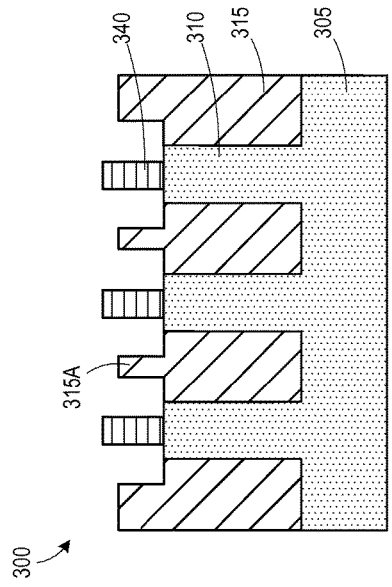
Figure 4I:
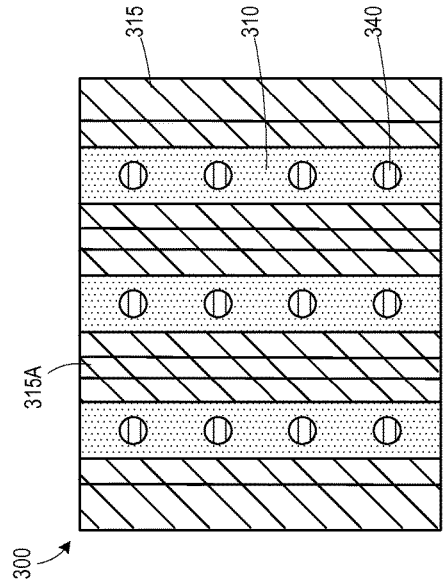
Figure 3H:
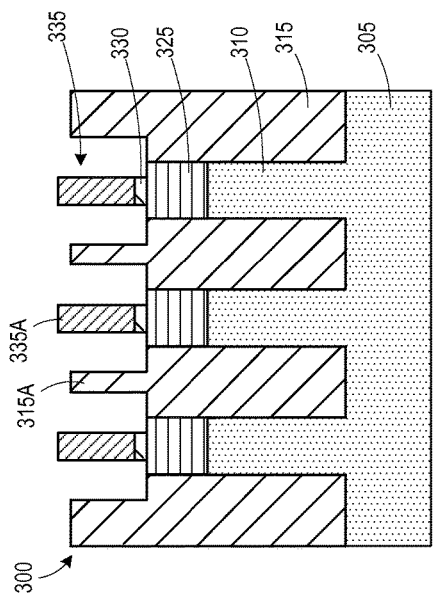
Figure 4H:
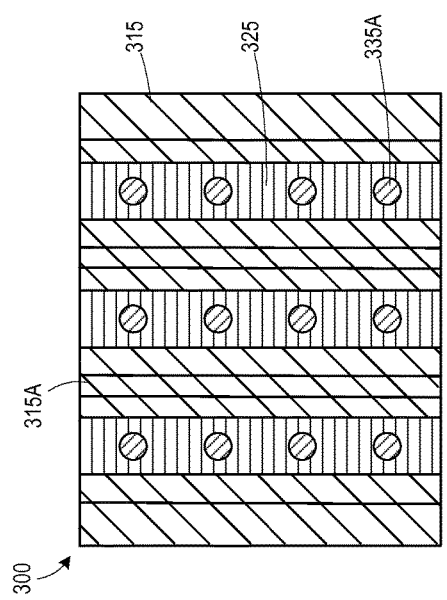

FIGS. 3I and 4I illustrate the device 300 after performing an anisotropic etch to pattern the nanowire material 325 to define vertical nanowires 340 and a second etch process to remove the DSA components 335A and remaining hard mask layer 330. The cross-sectional dimensions of the vertical nanowires 340 are determined by the intrinsic pitch of the DSA component 335A. The vertical nanowires 340 are substantially vertical in that they have roughly the same cross-section along their long axes. Of course, some variation may exist due to non-uniformities in the etching process. In general, the long axis of one of the vertical nanowires 340 is oriented substantially normally with respect to a top surface of the fin 310 and the vertical nanowires 340 have an oval shaped cross-section (e.g., circular).

Figure 3J:
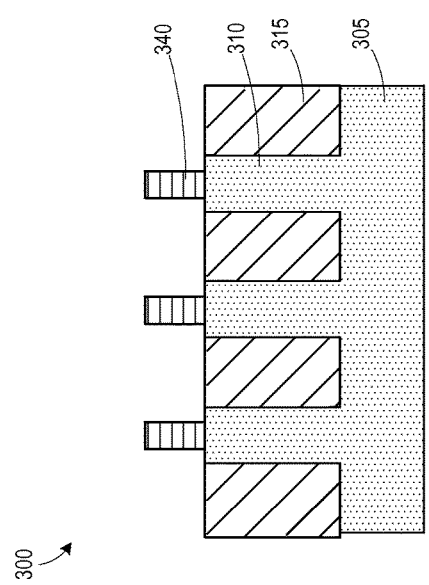
Figure 4J:
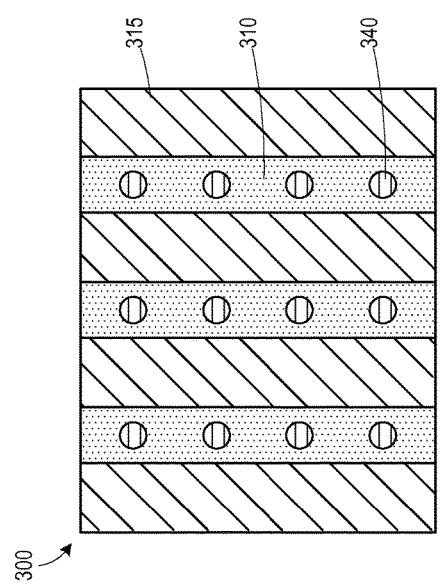

FIGS. 3J and 4J illustrate the device 300 after performing an etch process to remove the upstanding portions 315A in the insulating layer 315.

Figure 5A:
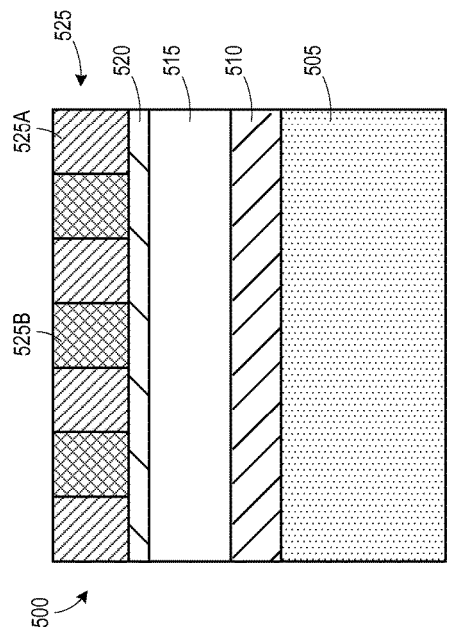
FIGS. 5A-5O are cross-sectional views of a device depicting methods disclosed herein for forming vertical nanowires using a cross-bar patterning process flow.
Figure 6A:
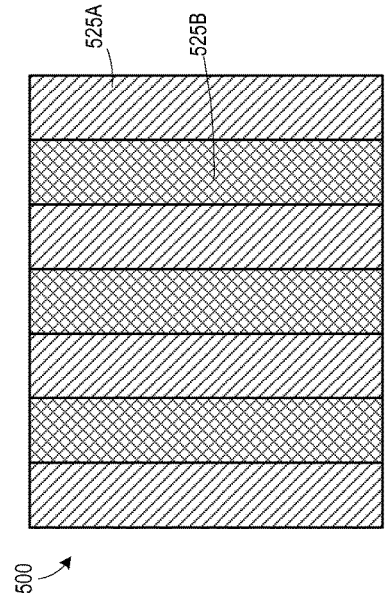
FIGS. 6A-6O are top views of the device corresponding to FIGS. 6A-6O.

FIGS. 5A-5O and 6A-6O illustrate an alternative method for forming vertical nanowires in a device 500 using a cross-bar patterning process. FIGS. 5A-5O show cross-sectional views of the device 500 and FIGS. 6A-6O show corresponding top views of the device 500. The device 500 includes a substrate 505 and a film stack including a fin hard mask layer 510, a spin on carbon (SOC) layer 515, a silicon-rich anti-reflective coating (SiARC or SiON) layer 520, and a DSA layer 525 including an etch-resistant component 525A and an etchable component 525B formed above the substrate 505. The DSA material 525 may be line-space forming, as illustrated, cylinder forming, or lamellar structure forming. The DSA pattern may be created using either directing techniques such as chemoepitaxy or graphoepitaxy and/or combined with other multipatterning (SADP) techniques to provide design flexibility. The substrate 505 may have a variety of configurations, as described above. In the illustrated embodiment, the DSA layer 525 is a block forming material, such as polystyrene (PS)-block-polymethylmethacrylate (PS-b-PMMA). The DSA layer 525 may include additional layers, such as a brush mat layer or a chemically-functionalized surface.

FIGS. 5B and 6B illustrate the device 500 after performing a selective etch process (e.g., wet or dry) to remove the component 525B selective to the component 525A. FIGS. 5C and 6C illustrate the device 500 after performing one or more etch processes to transfer the pattern defined by the component 525A into the SiARC layer 520 and subsequently into the SOC layer 515 and to remove any remaining portions of the component 525A. The SOC layer 515 acts as a hard mask layer during a subsequent etch for patterning the fin hard mask layer 510 and the substrate 505.

FIGS. 5D and 6D illustrate the device 500 after performing an anisotropic etch process to transfer the pattern defined by the SOC layer 515 into the fin hard mask layer 510 and the substrate 505 to define fins 530 in the substrate 505. Any remaining portions of the SiARC layer 520 or the SOC layer 515 may be removed by performing an additional selective etch process.

FIGS. 5E and 6E illustrate the device 500 after performing various processes, such as an etch process for removing the fin hard mask layer 510, a deposition process for forming an insulating layer 535 (e.g., silicon dioxide, low-k dielectric) between the fins 530, and, optionally, performing an annealing process to densify the insulating layer 535.

Figure 6G:
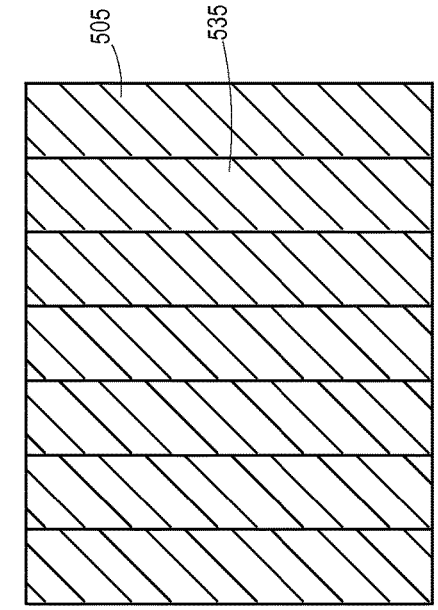
Figure 5G:
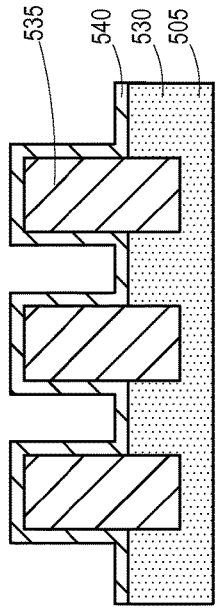
Figure 6F:
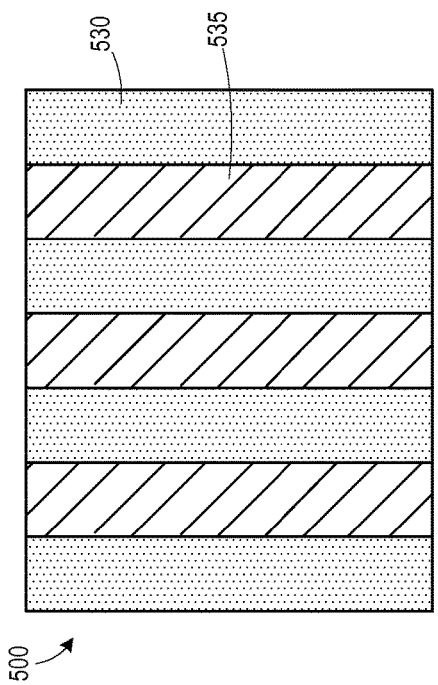
Figure 5F:
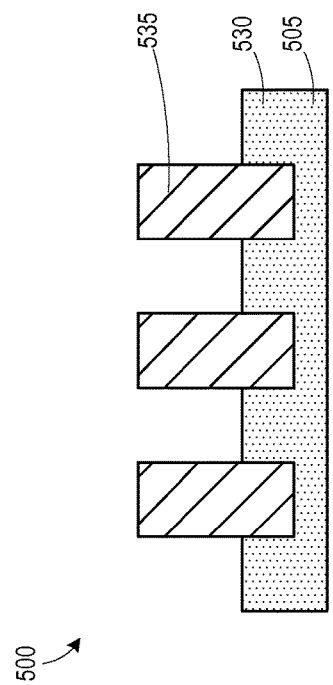

FIGS. 5F and 6F illustrate the device 500 after performing an etch process to recess the fins 530 relative to the insulating layer 535. FIGS. 5G and 6G illustrate the device 500 after performing a deposition process to form a hard mask layer 540 above the fins 530 and insulating layer 535. FIGS. 5H and 6H illustrate the device 500 after performing several deposition processes to form a film stack above the hard mask layer 540 including, a spin on carbon (SOC) layer 545, a silicon-rich anti-reflective coating (SiARC) layer 550, and a DSA layer 555 including an etch-resistant component 555A and an etchable component 555B. In the illustrated example, the second DSA layer 555 is rotated 90 degrees with respect to the original direction of the first DSA layer 525 to divide the subsequent patterns/device structures.

Figure 5I:
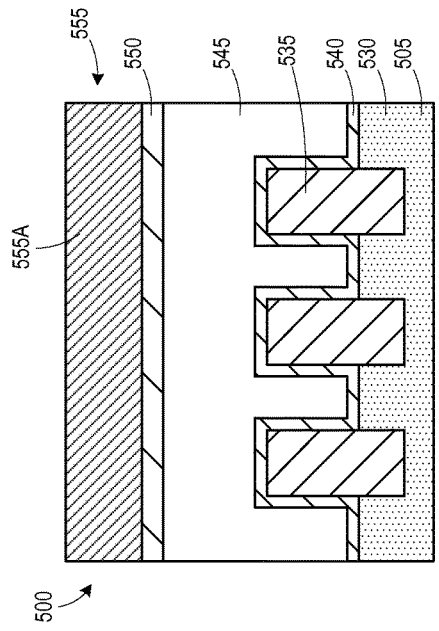
Figure 6I:
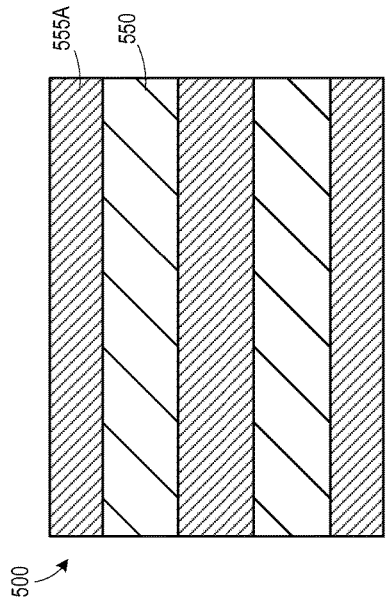
Figure 5H:
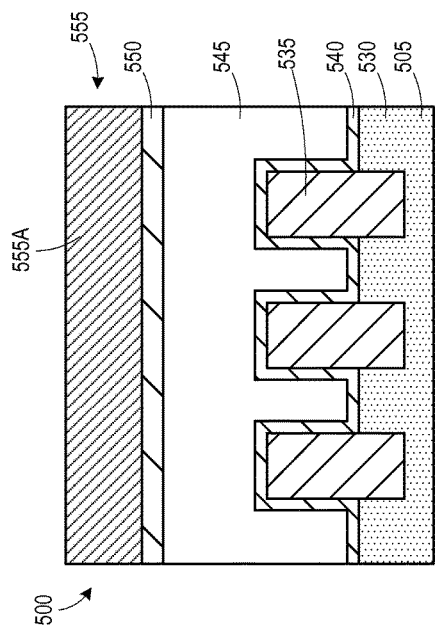
Figure 6H:
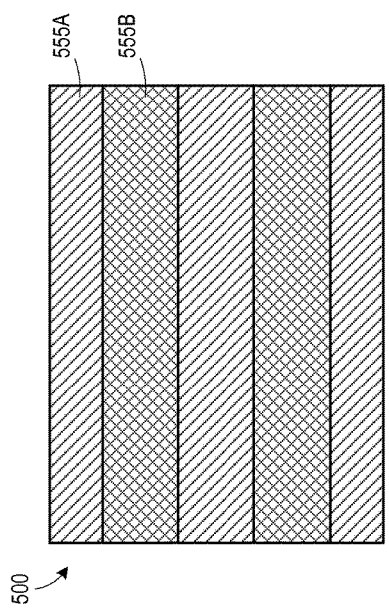

FIGS. 5I and 6I illustrate the device 500 after performing a selective etch process (e.g., wet or dry) to remove the component 555B selective to the component 555A. FIGS. 5J and 6J illustrate the device 500 after performing one or more etch processes to transfer the pattern defined by the component 555A into the SiARC layer 550 and subsequently into the SOC layer 545 and to remove any remaining portions of the component 555A. Note that the feature size and pitch for the second DSA layer 555 may be different from that of the first DSA layer 525, giving flexibility to form structures with variable cross-sections.

FIGS. 5K and 6K illustrate the device 500 after performing an anisotropic etch process to transfer the pattern defined by the SOC layer 545 into the hard mask layer 540 and performing etch processes to strip remaining portions of the SiARC layer 550 and the SOC layer 545.

FIGS. 5L and 6L illustrate the device 500 after performing an epitaxial growth process to define vertical nanowires 560 (e.g., epi-grown III-V or group IV materials—Si/SiGe/Ge, GaAs/InGaAs/InAs/GaSb/InGaSb, etc.) extending from the exposed surfaces of the fins 530. FIGS. 5M and 6M illustrate the device 500 after performing an optional chemical mechanical planarization (CMP) process to planarize the top surface. The vertical nanowires 560 are substantially vertical in that they have roughly the same cross-section along their long axes. Of course, some variation may exist due to non-uniformities in the epitaxial growth process. In general, the long axis of one of the vertical nanowires 560 is oriented substantially normally with respect to a top surface of the fin 530 and the vertical nanowires 560 have a generally rectangular cross-section.

FIGS. 5N and 6N illustrate the device 500 after performing a selective etch process to remove the hard mask layer 540. FIGS. 5O and 6O illustrate the device 500 after performing an etch process to recess the insulating layer 535. The cross-sectional dimensions of the vertical nanowires 560 are determined by the intrinsic pitches of the DSA components 525A and 555B.

Additional processing steps (not shown) may be performed to complete fabrication of the devices 100, 300, 500 once the vertical nanowires 135, 340, 560 are formed. For example, the vertical nanowires 135, 340, 560 may be used to fabricate vertical transistors, where doping or additional deposition processes may be performed to define source/drain and channel regions in or along the vertical nanowires 135, 340, 560. The vertical nanowires 135, 340, 560 may also be used as contact elements, such as where the fins define elements of a finFET transistor. The vertical nanowires 135, 340, 560 may be used to fabricate other types of devices, such as optical sensing devices or interconnects.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a first directed self-assembly material above a substrate, wherein said first directed self-assembly material is a first copolymer material;
    annealing said first directed self-assembly material to define an etch-resistant component and an etchable component;
    removing said etchable component of said first directed self-assembly material;
    patterning said substrate using a patterning process that employs said etch-resistant component of said first directed self-assembly material as an etch mask to define at least one fin in said substrate, said fin having a first long axis;
    forming a second directed self-assembly material above said at least one fin, wherein said second directed self-assembly material is a second copolymer material;
    annealing said second directed self-assembly material to define an etch-resistant component and an etchable component;
    removing said etchable component of said second directed self-assembly material to expose a top surface of said at least one fin; and forming a substantially vertical nanowire on said top surface of said at least one fin having a second long axis extending in a direction perpendicular to said first long axis of said at least one fin, wherein at least a first dimension of said vertical nanowire is defined by an intrinsic pitch of said first directed self-assembly material and a second dimension of said vertical nanowire is defined by an intrinsic pitch of said second directed self-assembly material.

2. The method of claim 1, wherein patterning said substrate further comprises:
forming a hard mask layer above said substrate;
patterning said hard mask layer using said first directed self-assembly layer as an etch mask to expose said substrate;
removing said first directed self-assembly material; and
patterning said substrate using said hard mask layer as an etch mask to define said at least one fin.

3. The method of claim 1, wherein said hard mask layer comprises a first film stack having a plurality of layers, and the method further comprises:
forming said first directed self-assembly layer above said first film stack;
etching a first layer of said first film stack using a portion of said first directed self-assembly layer as an etch mask;
removing said first directed self-assembly layer; and
etching a second layer of said first film stack using said first layer of said first film stack as an etch mask to expose said substrate.

4. The method of claim 2, further comprising:
etching said hard mask layer using said etch-resistant component as an etch mask to expose said substrate.

5. The method of claim 1, further comprising:
forming a hard mask layer above said at least one fin;
patterning said hard mask layer using said etch-resistant component of second directed self-assembly layer as an etch mask to expose a top surface of said at least one fin; and
forming said substantially vertical nanowire on said exposed top surface of said at least one fin.

6. The method of claim 5, further comprising:
removing said etchable component of said second directed self-assembly material to expose a portion of said hard mask layer; and
etching said hard mask layer using said etch-resistant component as an etch mask to expose a portion of said top surface of said at least one fin.

7. The method of claim 5, wherein said hard mask layer comprises a film stack having a plurality of layers, and the method further comprises:
forming said second directed self-assembly layer above said film stack;
etching a first layer of said film stack using said etch-resistant component of second directed self-assembly layer as an etch mask;
removing said etch-resistant component of second directed self-assembly layer; and
etching a second layer of said film stack using said first layer of said film stack as an etch mask to expose said top surface of said at least one fin.

8. The method of claim 5, further comprising:
forming an insulating layer adjacent said at least one fin; and
recessing said at least one fin prior to forming said hard mask layer.

9. The method of claim 1, wherein said vertical nanowire has a rectangular cross-section.

10. A method, comprising:
forming a first hard mask layer above a semiconductor substrate;
forming a first directed self-assembly material above said first hard mask layer, wherein said first directed self-assembly material is a first copolymer material;
annealing said first directed self-assembly material to define an etch-resistant component and an etchable component;
removing said etchable component of said first directed self-assembly material;
patterning said first hard mask layer using said etch resistant component of said first directed self-assembly material as an etch mask to expose a portion of said semiconductor substrate;
etching said semiconductor substrate using said patterned first hard mask layer as an etch mask to define at least one fin in said semiconductor substrate, said fin having a first long axis;
forming a second hard mask layer above said at least one fin;
forming a second directed self-assembly material above said second hard mask layer, wherein said second directed self-assembly material is a second copolymer material;
annealing said second directed self-assembly material to define an etch-resistant component and an etchable component;
removing said etchable component of said second directed self-assembly material;
patterning said second hard mask layer using said etch resistant component of said second directed self-assembly layer as an etch mask to expose a top surface of said at least one fin; and
forming a substantially vertical nanowire on said top surface of said at least one fin having a second long axis extending in a direction perpendicular to a said first long axis of said at least one fin, wherein at least a first dimension of said vertical nanowire is defined by an intrinsic pitch of said first directed self-assembly material and a second dimension of said vertical nanowire is defined by an intrinsic pitch of said second directed self-assembly material.

11. The method of claim 10, wherein said first directed self-assembly material includes an etch-resistant component and an etchable component, and the method further comprises:
removing said etchable component of said first directed self-assembly material to expose a portion of said first hard mask layer; and
etching said first hard mask layer using said etch-resistant component as an etch mask to expose a portion of said semiconductor substrate.

12. The method of claim 11, wherein said second directed self-assembly material includes an etch-resistant component and an etchable component, and the method further comprises:
removing said etchable component of said second directed self-assembly material to expose a portion of said second hard mask layer; and
etching said second hard mask layer using said etch-resistant component as an etch mask to expose a portion of said top surface of said at least one fin.

13. The method of claim 10, wherein said vertical nanowire has a rectangular cross-section.

14. The method of claim 10, further comprising:
forming an insulating layer adjacent said at least one fin; and
recessing said at least one fin prior to forming said second hard mask layer.

15. The method of claim 10, wherein said first hard mask layer comprises a first film stack having a plurality of layers, and the method further comprises:
forming said first directed self-assembly layer above said first film stack;
etching a first layer of said first film stack using a portion of said first directed self-assembly layer as an etch mask;
removing said first directed self-assembly layer; and
etching a second layer of said first film stack using said first layer of said first film stack as an etch mask to expose said semiconductor substrate.

16. The method of claim 15, wherein said second hard mask layer comprises a second film stack having a plurality of layers, and the method further comprises:
forming said second directed self-assembly layer above said second film stack;
etching a first layer of said second film stack using a portion of said second directed self-assembly layer as an etch mask;
removing said second directed self-assembly layer; and
etching a second layer of said second film stack using said first layer of said second film stack as an etch mask to expose said top surface of said at least one fin.

17. A semiconductor device, comprising:
at least one fin defined in a semiconductor substrate, wherein said at least one fin has a first long axis extending along a first length of said at least one fin in a direction parallel to an upper surface of said semiconductor substrate and a first width extending perpendicular to said first long axis in a direction parallel to said upper surface of said semiconductor substrate and said first length is greater than said first width; and
a substantially vertical nanowire disposed on a top surface of said at least one fin, wherein said substantially vertical nanowire has a rectangular cross section in a plane parallel to said top surface, has a width on a side of said rectangular cross section less than a width of said at least one fin, and has an axial length along a second long axis extending vertically from said top surface in a direction perpendicular to said top surface and perpendicular to said first long axis of said at least one fin.

18. The device of claim 17, further comprising:
a plurality of vertical nanowires each having a rectangular cross-section disposed on said top surface along a length of said at least one fin.

19. The device of claim 17, wherein said at least one fin is one of a plurality of fins defined in said semiconductor substrate, further comprising:
a plurality of substantially vertical nanowires each having a rectangular cross-section and being disposed on a top surface of at least a second fin other than said at least one fin; and
a dielectric material disposed between adjacent fins.

20. The device of claim 17, wherein said substantially vertical nanowires comprise a semiconductor material.

* * * * *